United States Patent [19]

Chang et al.

[11] Patent Number: 4,507,626
[45] Date of Patent: Mar. 26, 1985

[54] SWITCHED CAPACITOR SSB MODULATOR

[75] Inventors: Chieh Chang, Belmont; Man S. Lee, San Mateo, both of Calif.

[73] Assignee: GTE Lenkurt Incorporated, Phoenix, Ariz.

[21] Appl. No.: 392,973

[22] Filed: Jun. 28, 1982

[51] Int. Cl.³ .......................... H03C 1/02; H03K 7/00
[52] U.S. Cl. ................................ 332/31 R; 332/9 R; 332/45; 332/48; 329/163; 329/192
[58] Field of Search ...................... 332/9 R, 9 T, 31 R, 332/31 T, 44, 45, 48, 49, 56; 329/101, 102, 109, 178, 192; 307/264, 352, 353; 455/46, 47, 108, 109, 202, 203, 204, 337; 375/24, 41, 43, 61, 77, 94; 333/173; 328/150, 151

[56] References Cited

U.S. PATENT DOCUMENTS 3,482,174  12/1969  James ............................. 329/178 X
3,944,852   3/1976  Gilbert .......................... 332/9 T X
4,375,625   3/1983  Lee ............................... 328/167 X

FOREIGN PATENT DOCUMENTS 3022252  12/1981  Fed. Rep. of Germany ...... 333/173

OTHER PUBLICATIONS

Martin, K. "Switched-Capacitor Building Blocks for Adaptive Systems", *IEEE Xactions on Circuits and Systems*, vol. CA-S-28, No. 6, Jun. 1981, pp. 576-584.
Zomorrodi, M. "Switched-Capacitor Quadrature N-Path Filters", *Midwest Symposium on Circuits and Systems*, Jun. 1981, pp. 682-686.
Chang, C. "Switched-Capacitor Modem for Amplitude Modulation", *IEEE International Symposium on Circuits and Systems Proceedings*, Rome, Italy, May 10, 1982, pp. 557-560.
Taub, H. et al. *Principles of Communication Systems*, McGraw Hill Book Co., 1971, pp. 102-104.

*Primary Examiner*—Eugene R. LaRoche
*Assistant Examiner*—D. C. Mis
*Attorney, Agent, or Firm*—Russell A. Cannon

[57] ABSTRACT

An integrated single-sideband modulator comprises six integrated capacitors C1-C6 and first switch means alternately connecting C1 and C2 as feedback capacitors across a differential input operational amplifier A1. The amplifier has a virtual ground potential on its inverting input terminal for causing it to operate as a voltage source and render the circuit relatively insensitive to parasitic capacitance effects associated with capacitor plates. Second switch means cooperates with A1, C1 and C2 and is responsive to 4-phase clock signals for driving input capacitors C3-C6 so as to convert first and second quadrature-phase input signal voltages into first and second electrical charge flow signals on the inverting input terminal that are a function of products of representations of the first and second voltages in switch state time intervals and associated pulse trains which have a 90° phase difference therebetween and a repetitive pattern such as +1, +1, -1, -1, etc. The amplifier and feedback capacitors combine the charge signals for producing a single-sideband signal on A1's output terminal. This circuit is converted to a balanced modulator by omitting C5 and C6. In an alternate embodiment of a single sideband modulator that requires only a pair of switched capacitors C11 and C12, a 4-phase switch means alternately charges C11 and C12 with associated ones of the quadrature-phase input signal voltages while alternately connecting C12 and C11 as feedback capacitors across A1, the polarity of each capacitors feedback voltage being reversed each time that capacitor is connected across the amplifier. This circuit is operated as a balanced modulator by omitting one of the capacitors.

14 Claims, 3 Drawing Figures

SWITCHED CAPACITOR SSB MODULATOR

BACKGROUND OF INVENTION

This invention relates to switched capacitor circuits and more particularly either to one for generating a single-sideband signal or to one that is capable of performing amplitude modulation and/or demodulation functions.

Advances in MOS-LSI technologies and the development of switched capacitor techniques have improved the possibility of analog signal processing being done on a single chip. In order to perform such analog signal processing in a fully integrated circuit, however, circuits performing modulation and demodulation functions must be included. In the past, modulators and demodulators have historically employed resistors. It is desirable to achieve these functions in integrated circuits without using resistors, however, since integrated resistors require a considerable surface area of the associated semiconductor chip. A switched capacitor demodulator which does not require resistors is disclosed in the article Switched-Capacitor Building Blocks for Adaptive Systems by K. Martin and A. S. Sedra, IEEE Transactions on Circuits and Systems, Vol. CAS-28, No. 6, June 1981, pp. 576–584. Martin's demodulator comprises a switched capacitor low-pass filter with a switched input signal, see Section VI, pp. 580–581, and FIGS. 11 and 12 there. Switched capacitor modulators and/or demodulators are also briefly described in the article Switched Capacitor Quadrature N-Path Filters by M. Zomorrodi, Midwest Symposium on Circuits and Systems, pages 682–686, June 1981. Structure for generating single-sideband signals is illustrated and described in Principles of Communication Systems by H. Taub & D. L. Schilling, pp. 102–104, McGraw Hill Book Co., Copyright 1971.

An object of this invention is the provision of resistorless circuitry for use in performing amplitude modulation and/or demodulation functions.

SUMMARY OF INVENTION

In accordance with this invention, an integrable switched capacitor single-sideband modulator comprises: an operational amplifier having an input terminal and an output terminal; first and second capacitors C11 and C12; first means producing first and second quadrature phase signal voltage representations of a baseband input signal; and second means periodically operative in non-overlapping switch states which occur sequentially at a prescribed rate for charging C11 with the first signal voltage in a first train of alternate switch states, for charging C12 with the second signal voltage in a second train of alternate switch states which is different from the first train thereof, and for connecting C11 and C12 as feedback capacitors across the input and output terminals of the amplifier during switch states of the second and first trains thereof, respectively, with feedback voltages of polarities requiring generation of a single-sideband signal on the output terminal.

DESCRIPTION OF PREFERRED EMBODIMENTS

This invention is described in the article Switched Capacitor Modem For Amplitude Modulation by Man Shek Lee and Chieh Chang, 1982 IEEE International Symposium on Circuits and Systems Proceedings, Rome, Italy, May 10, 1982, pps. 557–560.

Figure 1:
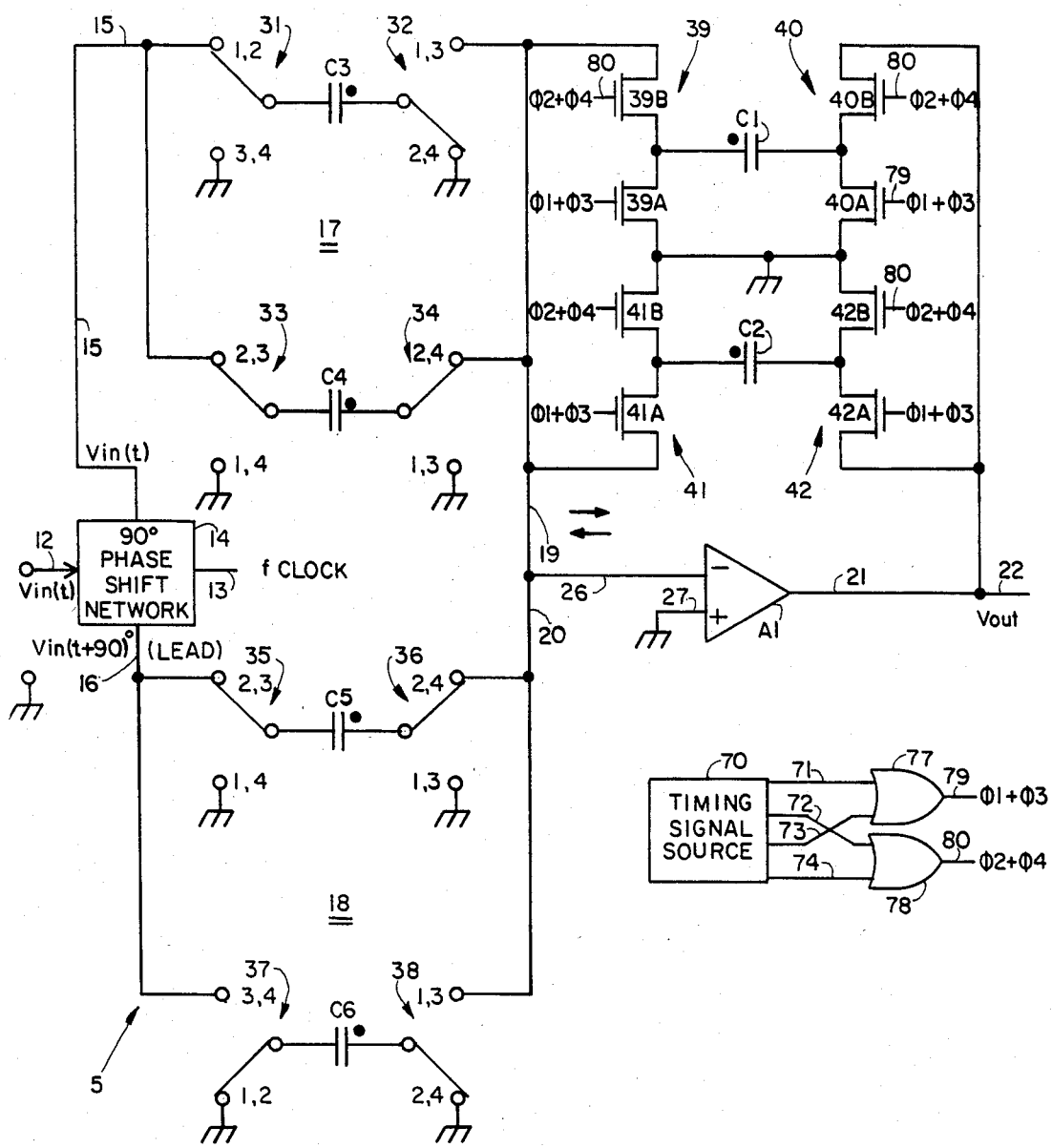
FIG. 1 is a schematic circuit diagram of a single-sideband signal generator circuit 5 embodying this invention, with some of the switch means there being shown in schematic form.

The integrated modulator circuit 5 in FIG. 1 comprises a 90° phase shift network 14; integrated capacitors C1–C6; a plurality of switch means 31–42; a single operational amplifier A1; and a multiphase clock timing signal source 70. The dots adjacent one sides of the integrated capacitors indicate the locations of top plates thereof.

The switch means 39–42 operate for alternately connecting C1 and C2 as feedback capacitors across A1, which is preferably a differential input operational amplifier. The amplifier is associated with the feedback capacitors C1 and C2 for operating as a voltage controlled voltage source have a very high input impedance and a very low output impedance, and providing whatever output current is demanded by external circuitry. The amplifier preferably has a larger voltage gain and an output voltage that is the gain times the difference between the two input voltages. The non-inverting input terminal 24 of A1 is directly electrically connected to ground for impressing a virtual ground potential on its inverting input terminal 26.

The network 14 is preferably driven by a voltage source (not shown) and is operative for producing signals on lines 15 and 16 that are quadrature-phase representations of a baseband analog input signal voltage Vin(t) on line 12. More specifically, the signals on lines 15 and 16 are replicas of the input signal that have a 90° phase difference therebetween. In FIG. 1, the signal on line 16 leads that on line 15 by +90°. In a fully integrated circuit structure, the network 14 may comprise a pair of switched capacitor all-pass networks that are realized with bi-quad circuits of the type described in the article "A Family of Active Switched Capacitor Bi-quad Building Blocks" by P. E. Fleischer et. al. in Bell Systems Technical Journal, pp. 2235–2269, December 1979. The network 14 is driven by a clock signal having a frequency fc and preferably comprises a pair of operational amplifiers operating as voltage sources and driving the output lines 15 and 16. The switched capacitor circuits 17 and 18 operate in combination with A1 and the feedback capacitors for essentially modulating the quadrature-phase input signals on lines 15 and 16 with quadrature-phase switched carrier signals having a frequency corresponding to the switching frequency at which the switch means operates. A 4-phase clock signal source 70 is used here for providing the 90° phase difference in these carrier signals. Summing of output charge signals from the circuits 17 and 18 is accomplished by A1 and the feedback capacitors.

Figure 3:
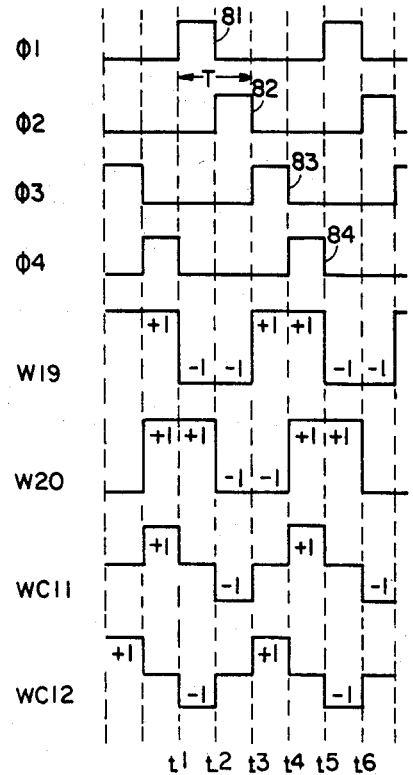
FIG. 3 is waveforms useful in describing the operation of the circuits 5 and 6.

In an integrated circuit embodiment of this invention that is implemented with MOS technology, each of the switch means 31–42 comprises a pair of series connected MOS FET transistors having gate electrodes that are driven by ones of the 4-phase non-overlapping digital timing control signals $\phi 1$–$\phi 4$ (see FIG. 3) that are produced by the source 70. This structure is illustrated in the switch means 39–42 in FIG. 1, where the other switch means 31–38 there are shown in schematic form. The pair of switching transistors 39A and 39B are connected in series between ground and the inverting input line 26. Similarly, The transistors 41B and 41A are connected in series between ground and line 26. The pairs of transistors of the switch means 40 and 42 are connected in a similar manner between ground and the output line 22. Each of the intermediate terminals between the transistors is connected to an associated one of the sides of the integrated capacitors C1 and C2. The gate electrodes of these switching transistors are driven by selected pairs of the timing control signals $\phi 1$–$\phi 4$ and have switching frequencies fs = 1/T, where T is the period of a switching cycle of C1 and C2 for accomplishing charging and discharging of the associated integrating or feedback capacitor. Assuming that the FET's here are turned on by a positive pulse, the term non-overlapping means that only one of the control signals $\phi 1$–$\phi 4$ is positive at an instant of time, although the negative portions thereof may overlap (see FIG. 3). In practice, one control pulse 81 goes negative immediately prior to the adjacent pulse 82 going positive. The timing signal for driving the gates of the transistors 39B–42B is obtained by combining $\phi 2$ and $\phi 4$ in an OR gate 78. Similarly, the timing signal for driving the gate electrodes of the transistors 39A–42A is obtained by combining $\phi 1$ and $\phi 3$ in an OR gate 77. Other combinations of the timing control signals are obtained in a similar manner. Switch states in which there are closed conditions of switching of associated FET's occur when timing control signals are positive in FIG. 1.

Considering the overall operation of the switch means in FIG. 1, it will be recognized that switch means 40 and 42 alternately connect the bottom plate of C1 and C2 to ground and to the output terminal of the voltage source A1. This renders the modulator 5 insensitive to bottom plate parasitic capacitance effects of both C1 and C2 since the output impedance of A1 is already substantially zero ohms. In a similar manner, switch means 39 and 41 alternately connect the top plate of C1 and C2 to ground and virtual ground for also rendering the circuit insensitive to parasitic capacitance effects associated with the other plates of integrated capacitors C1 and C2. Consideration of the phasing of switch means 31–38 also reveals that the modulator 5 is rendered insensitive to parasitic capacitance effects associated with plates of C3–C6 by switching them between ground and virtual ground, and between ground and the output of a voltage source. And if the network 14 does not comprise voltage sources driving the lines 15 and 16, the connections of C3–C6 may be reversed for rendering the circuit sensitive to only top plate parasitic capacitance effects, which are relatively low. Such a sensitivity of the circuit to parasitic capacitance causes a low frequency baseband signal component in the frequency spectrum in the output signal on line 22 which is normally not of serious concern in a SSB modulator. Parasitic capacitance effects may normally be compensated with techniques such as are described in the article Compensation for Parasitic Capacitances in Switched-Capacitor Filters by G. C. Temes and R. Gregorian, Electronics Letters, 1979, Vol. 15, pp. 377–379. Thus, it is seen that the operation of the modulator 5 is normally insensitive to parasitic capacitance effects associated with plates of integrated capacitors thereof.

In operation, switch means 39–42 are poled by $\phi 1$ and $\phi 3$ for connecting C2 as a feedback capacitor across A1 during pulses 81 and 83 in time slots t1-t2 and t3-t4, while connecting both sides of C1 to ground for discharging it and reestablishing the charge on it to a reference voltage which is zero volts here. The switch means 39–42 are poled by $\phi 2$ and $\phi 4$ for connecting C1 and C2 in a similar manner in the pulses 82 and 84 of time slots t2-t3 and t4-t5.

In contrast, the switch means 31 and 32 are successively poled by pulses in $\phi 1$–$\phi 4$ for sequentially connecting the bottom and top plates of C3: in series between line 15 and the inverting input line 26 of A1 for charging C3 and C2 with the in-phase signal Vin(t) during the pulse 81 in $\phi 1$; to line 15 and ground for charging C3 with Vin(t) during the pulse 82 in $\phi 2$; to ground and the inverting input terminal of A1 in the pulse 83 in $\phi 3$ for transferring the charge on C3 to feedback capacitor C2; and both to ground for discharging C3 in the pulse 84 in $\phi 4$. The switch means 33 and 34 are successively poled by pulses in $\phi 2$, $\phi 3$, $\phi 4$ and $\phi 1$ for sequentially connecting C4 in a similar manner with respect to C1, but 90° out of phase with connections of C3. That is, each of these connections is accomplished for C4 one time slot later than for C3 so that the phasing of C4 lags that for C3 by 90°. These connections of C3 and C4 cause the amplifier and feedback capacitors C1 and C2 to convert the input voltage on line 15 to a representative electrical charge flow signal on line 26 which is proportional to the product of the magnitude of the input voltage samples in time slots and the repetitive pattern $-1$, $-1$, $+1$, $+1$ in successive time slots 81–84, the pattern being illustrated by the waveform W19 in FIG. 3. Stated differently, this operation effectively causes the closed loop gain of circuit 5 to be either $-1$ or $+1$ (i.e., either inverting or non-inverting) in times during which it operates on a representation or sample or sensing of the input signal.

Similarly, the switch means 35 and 36 are successively poled by pulses in $\phi 2$, $\phi 3$, $\phi 4$, and $\phi 1$ for connecting C5 in association with the quadrature-phase signal voltage Vin(t+90°) on line 16 in-phase with operation of C4. Finally, the switch means 37 and 38 are sucessively poled by pulses in $\phi 3$, $\phi 4$, $\phi 1$ and $\phi 2$ for connecting C6 in association with Vin(t+90°) and 180° out-of-phase with the operation of C3. The amplifier and feedback capacitors cooperate with this switching of C5 and C6 for converting the quadrature-phase input voltage on line 16 to a representative electrical charge flow signal on line 26 which is proportional to the product of samples of this input voltage in time slots and the repetitive pattern $+1$, $-1$, $-1$, $+1$ in successive pulses 81–84, the pattern being illustrated by waveform W20 in FIG. 3. This operation also causes the closed loop gain of circuit 5 to provide either inversion or non-inversion of representations of Vin(t+90°) in time slots. Consideration of these patterns, associated with the operation of A1 and pairs of input capacitors C3–C4 and C5–C6, reveals that they are 90° out of phase (W20 lagging W19 by 90°), such that they essentially represent the quadrature-phase carrier signals which are required for single-sideband modulators. The amplifier and feedback capacitors C1 and C2 cooperate for combining the charge flow signals on line 26 and producing an upper sideband output signal voltage on line 22. A lower sideband signal is readily obtained by causing the network 14 to produce the quadrature-phase and in-phase signals on lines 15 and 16, respectively. The modulator 5 also operates for producing different sideband signals when the phasing of both pairs of control signals $\phi 1$, $\phi 3$ and $\phi 2$, $\phi 4$ are interchanged (i.e., $\phi 1$ is interchanged with $\phi 3$ and $\phi 2$ is interchanged with $\phi 4$) for one of the capacitor pairs C3-C4 and C5-C6 or all four of the capacitors C3-C6. Stated differently, two of the capacitors C3-C6 operate in-phase with each other and the other two capacitors must operate 180° out-of-phase with each other and 90° out-of-phase with the first named two capacitors. The sequencing or order of connecting or switching each of the input capacitors C3-C6, however, remains the same in each case.

In the modulator 5, the capacitances C1=C2 and C3=C4=C5=C6 for causing balanced operation of the circuit, i.e., multiplication of the input signal by the same constant (e.g. $\pm K = \pm 1$) in each time slot. If these capacitors are not of the same values, the input signal may be multiplied by $+J$ and $-K$ in different time slots where $J \neq K$. Stated differently, if C3$\neq$C4 and C4=C5=C6, then the repetitive pattern in W19 may be $-J$, $-K$, $+J$, $+K$, where $J \neq K$. And if C3=C4, C5=C6, and C4$\neq$C5 then the repetitive patterns in W19 and W20 may be $-J$, $-J$, $+J$, $+J$, and $+K$, $-K$, $-K$, $+K$, where $J \neq K$. This causes baseband signal feedthrough, which must be filtered out of the single-sideband output signal on line 22. The capacitance ratio C1/C3 establishes the magnitude of the closed loop gain K of the circuit, where K=1 when all of the capacitances C1-C6 are of the same value. This modulator 5 also has baseband feedthrough whenever one of the capacitors C3-C6 is connected in series between one of the lines 15 and 16 and the inverting input of A1. As stated previously, this baseband signal can be filtered from the output signal on line 22.

Figure 2:
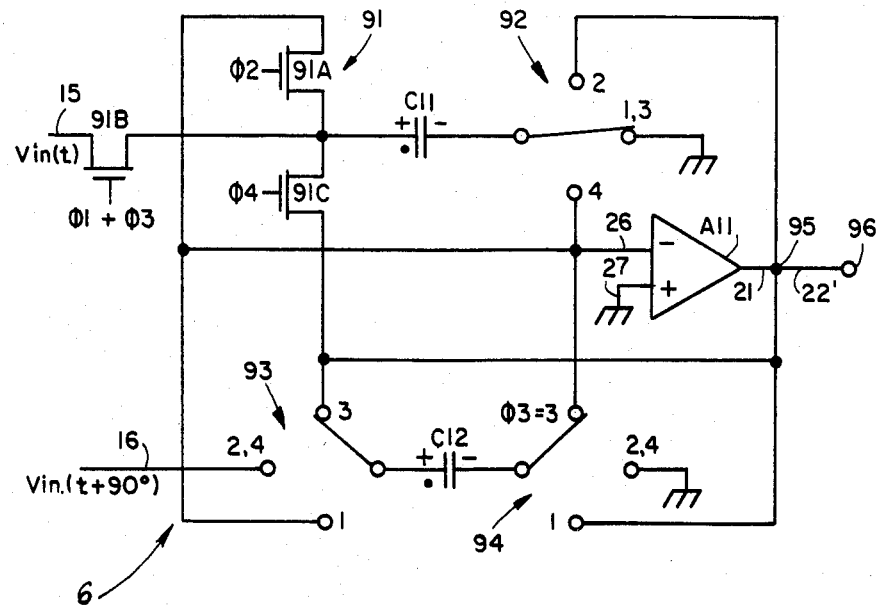
FIG. 2 is a schematic circuit diagram of an alternate embodiment 6, with some switch means there being shown in schematic form.

An alternate embodiment of this invention in FIG. 2 comprises only a pair of integrated capacitors C11 and C12, and switch means 91-94 for alternately charging one capacitor while the other capacitor is electrically connected as a feedback capacitor across A11. Since the switch means have essentially the same structure, only the switch means 91 is shown in detail, the other switch means 92-94 being shown in schematic form.

The switch means 91 comprises three MOS FET transistors 91A, 91B, and 91C which have one sides thereof connected to the top plate of C11. The other sides of these transistors 91A, 91B, and 91C are connected to the inverting input line 26, the input line 15, and the output terminal 21 of A11, respectively. The gate electrodes of these transistors are driven by designated control signals. Transistors (not shown) of switch means 93 are connected in a similar manner in association with Vin(t+90°). Transistors of switch means 92 and 94 are also connected in a similar manner, but are associated with ground instead of ones of the in-phase and quadrature-phase input signals. These switch means are driven by ones of the control signals $\phi 1$-$\phi 4$ in FIG. 3.

In operation, the switch means 91-94 are poled by $\phi 1$ for charging C11 with the in-phase input voltage in the designated polarity while connecting C12 as a feedback or integrating capacitor across A11 in one polarity (with the positive side of C12 connected to the inverting input line 26). These switch means are then poled by $\phi 2$ for now connecting C11 across A11 in the one polarity while charging C12 with the quadrature-phase input signal in the designated polarity. This causes A11 to essentially perform an inverting function on the quadrature-phase and in-phase input signal samples in sucessive time slots 81 and 82. The next odd numbered control signal $\phi 3$ drives the switch means for again charging C11 with the voltage on line 15 in the same polarity while now connecting C12 as a feedback capacitor across A11 in the opposite polarity so that A11 now performs a non-inverting function on the quadrature-phase input signal. Similarly, $\phi 4$ drives switch means 91-94 for charging C12 while simultaneously connecting C11 as a feedback capacitor across A11 in the opposite polarity. This causes A11 to essentially perform a non-inverting function on signal samples, i.e., to pass samples of the quadrature-phase and in-phase input voltages without inversion during successive pulses 83 and 84. Stated differently, this poling of the switch means 91-94 in four successive time slots essentially causes A11 to multiply in-phase and quadrature-phase samples of the input voltage by repetitive patterns of the form 0, $-1$, 0, $+1$ which are 90° out-of-phase with each other. Repetitive patterns are shown in waveforms WC11 and WC12 of FIG. 3 for these in-phase and quadrature-phase input signals. This causes A11 to produce a lower sideband signal in this case. An upper sideband signal is readily obtained by requiring the network 14 to produce the quadrature-phase and in-phase signals on lines 15 and 16, respectively. The modulator 6 also operates for producing different sideband signals by varying phasing or poling of the switch means 91-94 so as to invert one of the patterns (e.g., from 0, $-1$, 0, $+1$ to the pattern 0, $+1$, 0, $-1$).

This circuit 6 has particular advantage in that it is not essential that the capacitances of C11 and C12 be of the same values. And, since the capacitors C11 and C12 alternately perform sample and hold functions, i.e., they are never connected in series between one of the input lines 15 and 16 and A11, there is no feedthrough of a baseband input signal here. Also, this modulator 6 is inherently fast since the output of A1 only has to drive any bottom plate parasitic capacitance of a feedback capacitor C1 or C2 and the input capacitance of the next stage. The modulator 6 is sensitive to parasitic capacitance effects associated with only the top plates of C11 and C12 in FIG. 2, however, since they are switched between the output terminals of a voltage source (driving lines 15 and 16) and a virtual ground potential on line 26. This parasitic capacitance may normally be compensated for with techniques that are well known in the art. Any resultant feedthrough of a baseband input signal is not a serious problem, however, since it can be filtered out of the resultant single-sideband signal on line 22'.

In an embodiment of this invention that was fabricated with discrete integrated circuits and chip capacitors and which was successfully operated, the network 14 comprised a pair of second order all-pass switched capacitor filters. This network 14 provided the requisite 90° phase shift within 2° for a baseband input signal on line 12 having a frequency varying from 300 to 3000 Hz and driven by a clock frequency of 16 Kz. The capacitors C11 and C12 both had capacitances of 100 picofared, and A1 had a gain in the order of 10,000. The switch means 91-94 were driven with 80 KHz control signals each having substantially a 50% duty cycle. This modulator provided 30 dB of suppression of the unwanted sideband. This sideband suppression could be increased significantly by matching components of the modulator.

Although this invention is described in relation to preferred embodiments thereof variations and modifications will occur to those skilled in the art. By way of example, the modulator 5 in FIG. 1 may be operated as a balanced modulator by omitting the network 14 and capacitors C5–C6. Also, the circuit of FIG. 2 may be operated as a balanced modulator or demodulator by omitting C12 and network 14. Parasitic capacitance across A11, since the latter is not ideal, then operates as a feedback capacitor during charging of C11 for holding the prior charge on C11 and rendering A11 stable during this half cycle. Alternatively, the output terminal of A11 may be open circuited or short circuited during charging of C11. This is readily accomplished with one or a pair of MOS FETs by opening the line 22′, connecting one of the MOS FETs between nodes 95 and 96 (the latter having the input capacitance of the subsequent stage connected between it and ground), connecting the other MOS FET between node 95 and ground, driving the gate electrode of the one FET with $\phi 2$ and $\phi 4$, and driving the gate electrode of the other FET with $\phi 1$ and $\phi 3$. Only the one FET is required for open circuiting the output terminal of A11 during $\phi 1$ and $\phi 3$. Additionally, A11 may comprise other types of voltage sources, although it is desirable that its output impedance be very low and that its input terminal have a virtual ground thereon for rendering the circuit relatively insensitive to parasitic capacitance effects of capacitor plates and the input capacitance of the succeding stage. Further, the circuit may be realized with integrated circuit technologies other than MOS, in other than fully integrated circuit form, and fully or partially implemented with discrete components. Also, the switch means may comprise other types of switching elements such as discrete transistors, mechanical switches, relays, or other types of integrated switches. And the duty cycles of the various timing control signals for the modulators and/or demodulators may be less than substantially 50% and have different durations. Also, the switch means 91–94 may be poled for alternately reversing the polarity or direction that a particular capacitor is charged rather than alternately connecting it across A11 in the opposite direction. Further, switch means 32, 38 and 41 may share switching transistors since they are poled for making similar connections. The switch means 34, 36 and 39 may share individual switches for a similar reason. The scope of this invention is therefore to be determined from the appended claims, rather than from the detailed descriptions of preferred embodiments thereof.

What is claimed is:

1. An integrable switched capacitor single-sideband modulator comprising:
    an operational amplifier having an input terminal and an output terminal;
    first and second capacitors C1 and C2;
    first means responsive to a baseband input signal for producing first and second quadrature phase signal voltage representations thereof; and
    switch means periodically operative in combination with said amplifier in non-overlapping switch states which occur sequentially at a prescribed rate, adjacent pairs of switch states being defined as those occuring in adjacent pairs of different and distinct ones of four consecutive time slots, for alternately charging C1 and C2 with associated ones of the first and second signal voltages in first and second time slots, respectively, of each adjacent pair thereof for obtaining sample voltages, and alternately connecting C1 and C2 as feedback capacitors across input and output terminals of said amplifier in second and first time slots, respectively, of each adjacent pair thereof with the capacitor charge voltages across said amplifier being of a polarity causing said amplifier to produce a single-sideband signal on said output terminal.

2. The modulator according to claim 1 wherein said amplifier has a reference potential on said input terminal thereof and operates in cooperation with alternate ones of said feedback capacitors as a voltage source.

3. The modulator according to claim 2 wherein said amplifier comprises a differential input operational amplifier having its non-inverting input terminal electrically connected to ground for impressing a virtual ground potential on its inverting input terminal which corresponds to said input terminal.

4. The modulator according to claim 2 wherein said switch means connects C1 so as to reverse the polarity of the C1 charge voltage that is impressed across the input and output terminals of said amplifier in the second time slot of each adjacent pair thereof.

5. The modulator according to claim 4 wherein said switch means connects C2 so as to reverse the polarity of the C2 charge voltage that is impressed across the input and output terminals of said amplifier in the first time slot of each adjacent pair thereof.

6. The modulator according to claim 1 wherein C1 and C2 are alternately connected as a feedback capacitor across said amplifier so as to produce an output voltage that is proportional to the combination of the product of the associated sample voltage thereon and sequential values of associated first and second trains of pulses of the form $0, -K, 0, +K \ldots$, where K is a constant and associated pulse trains for C1 and C2 are 90° out of phase.

7. The modulator according to claim 6 wherein $K=1$.

8. The modulator according to claim 6 wherein the pulse train associated with the sample-charge voltage on C1 leads that associated with the sample-charge voltage on C2 for producing an output voltage of one sideband.

9. The modulator according to claim 6 wherein the pulse train associated with the sample-charge voltage on C1 lags that associated with the sample-charge voltage on C2 for producing an output voltage of an other sideband.

10. The modulator according to claim 6 wherein said capacitors are integrated capacitors.

11. An integrable switched capacitor single-sideband modulator comprising:
    an operational amplifier having an input terminal and an output terminal;
    first and second capacitors C1 and C2;
    first means responsive to a baseband input signal for producing first and second quadrature phase signal voltage representations thereof; and
    switch means periodically operative in combination with said amplifier in non-overlapping switch states which occur sequentially at a prescribed switching frequency and which are closed conditions of switching which occur in associated ones of consecutive time intervals for: charging C1 with the first signal voltage in a first series of switch states in alternate time intervals; charging C2 with the second signal voltage in a second series of switch states in alternate time intervals and which is different from said first series thereof; and connecting C1 and C2 as feedback capacitors across said input and output terminals of said amplifier during switch states of said second and first series thereof, respectively, with capacitor charge voltages of polarities resulting in generation of a single-sideband signal on said output terminal.

12. The modulator according to claim 11 wherein said amplifier has a virtual ground potential on said input terminal thereof and operates in cooperation with alternate ones of said feedback capacitors as a voltage source.

13. The modulator according to claim 12 wherein said switch means connects C1 so as to reverse the polarity of the C1 charge voltage that is impressed across the input and output terminals of said amplifier for each switch state of said second series.

14. The modulator according to claim 13 wherein said switch means connects C2 so as to reverse the polarity of the C2 charge voltage that is impressed across the input and output terminals of said amplifier for each switch state of said first series.

* * * * *